(12) United States Patent
Kim et al.

(10) Patent No.: US 11,635,841 B1
(45) Date of Patent: Apr. 25, 2023

(54) POWER SUPPLY AND TOUCH DISPLAY DEVICE INCLUDING THE SAME

(71) Applicant: LG Display Co., Ltd., Seoul (KR)

(72) Inventors: Dongju Kim, Paju-si (KR); Wonyong Jang, Bucheon-si (KR); Hoon Jang, Goyang-si (KR); Juno Hur, Daegu (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/890,799

(22) Filed: Aug. 18, 2022

(30) Foreign Application Priority Data

Dec. 3, 2021 (KR) .......................... 10-2021-0172344

(51) Int. Cl.
*G06F 3/041* (2006.01)
*G09G 3/20* (2006.01)
*H01L 27/32* (2006.01)

(52) U.S. Cl.
CPC .......... *G06F 3/0416* (2013.01); *G06F 3/0412* (2013.01); *G09G 3/20* (2013.01); *G09G 2330/021* (2013.01); *H01L 27/323* (2013.01)

(58) Field of Classification Search
CPC ....... G06F 3/0412; G06F 3/0416; G09G 3/20; H01L 27/323

USPC ................................................. 345/173, 174
See application file for complete search history.

(56) References Cited

U.S. PATENT DOCUMENTS

| | | | |
|---|---|---|---|
| 2009/0146964 A1* | 6/2009 | Park | G06F 3/047 345/173 |
| 2010/0220069 A1* | 9/2010 | Choi | G06F 3/042 345/173 |
| 2021/0181847 A1* | 6/2021 | Noh | G06F 3/016 |

\* cited by examiner

*Primary Examiner* — Calvin C Ma
(74) *Attorney, Agent, or Firm* — Fenwick & West LLP

(57) ABSTRACT

A touch display device operates between a normal mode and a sleep mode, the touch display device including: a display panel; a touch panel; a data drive circuit to supply a data voltage; a touch drive circuit to supply a touch driving signal; a timing controller to supply a data control signal; a micro-control unit to supply a touch synchronization signal; and a power supply to supply a first and second driving voltage, the power supply including: a first converter to output the first driving voltage; a second converter to output the second driving voltage; a first switching unit to supply the first or second input voltage to the first converter; a second switching unit to supply the first or second input voltage to the second converter; and a switching control circuit to control the first and second switching units. Therefore, power consumption of the power supply is reduced.

16 Claims, 9 Drawing Sheets

POWER SUPPLY AND TOUCH DISPLAY DEVICE INCLUDING THE SAME

CROSS-REFERENCE TO RELATED APPLICATION

This application claims the priority of Republic of Korea Patent Application No. 10-2021-0172344 filed on Dec. 3, 2021, in the Korean Intellectual Property Office, which is incorporated by reference in its entirety.

BACKGROUND

Field

The present disclosure relates to a power supply and a touch display device including the same, and more particularly, to a power supply capable of operating in a sleep mode, and a touch display device including the same.

Description of the Related Art

As the information-oriented society is implemented, there is an increasing demand for various display devices for displaying images. Recently, various display devices such as a liquid crystal display (LCD) device, a plasma display panel (PDP), and an organic light-emitting display (OLED) device have been used.

A touch display device made by adding a touch panel on the liquid crystal display device is widely used. The touch display device detects a touch point when electrical properties such as resistance or capacitance are changed at the touch point touched by a user's hand or a stylus pen and outputs information corresponding to the touch point or performs computation. The touch display device is one of the user interfaces, and the range of applications of the touch display device is expanded to small-scale portable terminals, office devices, mobile devices, and the like.

However, in a case in which a separate touch panel is added on the touch display device, a thickness of the display device increases, which causes a limitation in manufacturing a thin touch display device. Further, because the light passes through the stacked touch panel, light transmission efficiency decreases, which increases production costs. Recently, to solve the above-mentioned problems, there has been proposed an advanced-in-cell-touch (AIT) type touch sensor display device in which a touch sensor is embedded in a pixel area of a touch display device.

Meanwhile, when there is no touch sensing for a predetermined time according to a sensing result on the display panel, a sleep mode is operated to allow only a minimum number of circuit blocks to operate, thereby reducing power consumption.

However, a circuit block used in a normal mode and a circuit block used in the sleep mode are separately provided. For this reason, a relatively large number of circuit blocks are required to allow the touch display device to operate in the normal mode and the sleep mode.

For this reason, there is a problem in that the number of manufacturing processes and costs increase as the number of circuit blocks increases. Further, there is also a problem in that the transmission of signals between the circuit block is complicated, which causes a signal delay that leads to deterioration in touch performance.

SUMMARY

An object to be achieved by the present disclosure is to provide a touch display device capable of operating in a normal mode and a sleep mode and reducing the number of circuit blocks.

Another object to be achieved by the present disclosure is to provide a display device capable of improving touch sensing performance and reducing power consumption.

Objects of the present disclosure are not limited to the above-mentioned objects, and other objects, which are not mentioned above, can be clearly understood by those skilled in the art from the following descriptions.

According to an aspect of the present disclosure, a touch display device is configured to operate divided into a normal mode in which the touch display device performs both a touch function and a display function and a sleep mode in which the touch display device performs only a touch function, and the touch display device includes: a display panel on which a plurality of pixels is disposed; a touch panel on which a plurality of touch sensors is disposed; a data drive circuit configured to supply a data voltage to the plurality of pixels; a touch drive circuit configured to supply a touch driving signal to the plurality of touch sensors; a timing controller configured to supply a data control signal to the data drive circuit; a micro-control unit configured to supply a touch synchronization signal to the touch drive circuit; and a power supply configured to supply a first driving voltage and a second driving voltage to the timing controller and the micro-control unit, in which the power supply includes: a first converter configured to output the first driving voltage; a second converter configured to output the second driving voltage; a first switching unit configured to supply the first input voltage or the second input voltage to the first converter; a second switching unit configured to supply the first input voltage or the second input voltage to the second converter; and a switching control circuit configured to control the first switching unit and the second switching unit. Therefore, it is possible to minimize power consumption of the power supply.

According to another aspect of the present disclosure, a power supply, which is configured to supply a first driving voltage for a display operation of a touch display device and a second driving voltage for a touch operation of the touch display device is provided, the power supply comprise a first converter configured to output the first driving voltage; a second converter configured to output the second driving voltage; a first switching unit configured to output any one of a first input voltage and a second input voltage to the first converter according to a switching control signal; a second switching unit configured to output any one of the first input voltage and the second input voltage to the second converter according to the switching control signal; and a switching control circuit configured to output the switching control signal.

Other matters of the exemplary embodiments are included in the detailed description and the drawings.

According to the present disclosure, the converter provided in the power supply is used in common in the normal mode and the sleep mode, which makes it possible to simplify the circuit configuration of the power supply.

In addition, according to the present disclosure, it is possible to minimize power consumption because the circuit configuration of the power supply is simplified.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
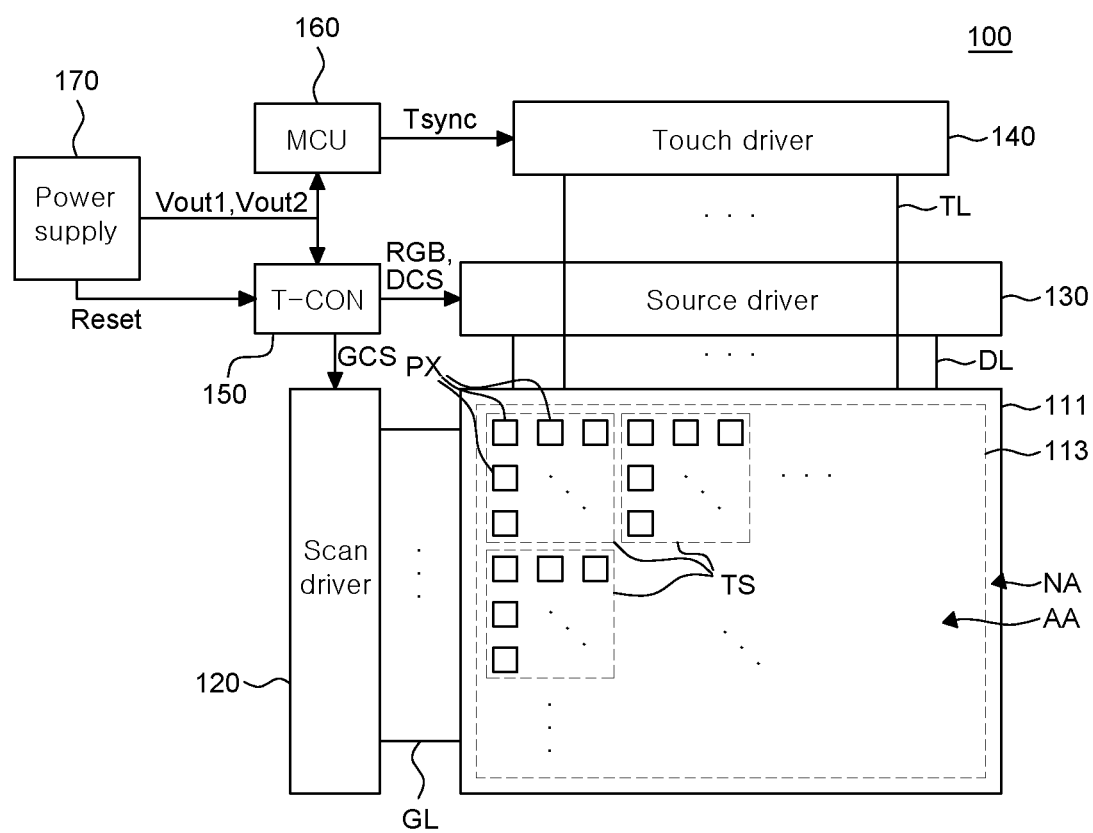
FIG. 1 is a block diagram for explaining a touch display device according to an embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

FIG. 1 is a block diagram for explaining a touch display device according to an embodiment of the present disclosure.

Referring to FIG. 1, a touch display device 100 includes a display panel 111, a touch panel 113, a gate drive circuit (scan driver) 120, a data drive circuit (source driver) 130, a touch drive circuit (touch driver) 140, a timing controller (T-CON) 150, a micro-control unit (MCU) 160, and a power supply 170.

In one embodiment, the display panel 111 includes a substrate made of glass or plastic, and a plurality of gate lines GL and a plurality of data lines DL that intersect one another on the substrate. A plurality of pixels PX are provided at intersection points between the plurality of gate line GL and the plurality of data lines DL. Further, an area in which the plurality of pixels PX for implementing images is disposed may be referred to as a display area AA. An area disposed at an outer periphery of the display area AA and having no pixel PX may be referred to as a non-display area NA. An image is not displayed in the non-display area NA due to lack of pixels PX in the non-display area NA.

The plurality of pixels PX of the display panel 111 may each have at least one thin-film transistor.

Further, in a case in which the touch display device 100 according to the embodiment of the present disclosure is an electroluminescent display device, electric currents are applied to electroluminescent diodes provided in the plurality of pixels PX, and emitted electrons and positive holes are combined, such that excitons are produced. Further, the excitons emit light, thereby implementing gradations of the electroluminescent display device.

However, the touch display device 100 according to the embodiment of the present disclosure is not limited to an electroluminescent display device. The touch display device 100 may another type of display device, such as a liquid crystal display device, having various shapes.

The touch panel 113 detects a user's touch input. Specifically, the touch panel 113 includes a plurality of touch sensors TS, and each of the touch sensors TS detects the user's touch. The touch sensor TS may have a size corresponding to a size of each of the plurality of pixels PX.

Further, the touch panel 113 may be manufactured separately from the display panel 111 and attached, in an add-on manner, to the display panel 111 or embedded in the display panel 111.

Specifically, in the case in which the touch panel 113 is embedded in the display panel 111, the plurality of touch sensors TS may be disposed in an in-cell manner or an on-cell manner and manufactured together with the display panel 111 when the display panel 111 is manufactured.

For example, the touch sensor TS may be disposed, through touch-on-encapsulation (TOE), on a sealing layer (encapsulation) that covers the electroluminescent diodes respectively included in the plurality of pixels PX. However, the shape of the touch panel 113 is not limited to the above-mentioned shape and may be variously changed in accordance with necessity of design.

The timing controller 150 receives timing signals such as a vertical synchronization signal, a horizontal synchronization signal, a data enable signal, and a data clock signal through a receiving circuit such as an LVDS or TMDS interface connected to a host system. Based on the inputted timing signal, the timing controller 150 generates control signals DCS and GCS for controlling the data drive circuit 130 and the gate drive circuit 120.

For example, to control the gate drive circuit 120, the timing controller 150 outputs various gate control signals (GCS) including a gate start pulse, a gate shift clock, a gate output enable signal, and the like.

In this case, the gate start pulse controls operation start timing of the gate drive circuit 120. The gate shift clock is a clock signal inputted in common to one or more gate circuits and controls shift timing of a gate voltage. The gate output enable signal assigns output timing information of the gate drive circuit 120.

In addition, to control the data drive circuit 130, the timing controller 150 outputs various data control signals (DCS) including a source start pulse, a source sampling clock, a source output enable signal, and the like.

In this case, the source start pulse controls data sampling start timing of one or more source drive integrated circuits (SDIC) that constitute the data drive circuit 130. The source sampling clock is a clock signal for controlling the sampling timing of data for each data circuit. The source output enable signal controls output timing of the data drive circuit 130.

Further, the timing controller 150 transmits digital video data RGB to the data drive circuit 130. The digital video data RGB are converted into analog data voltages by the data drive circuit 130, and the analog data voltages are outputted to the respective pixels PX disposed in the display area AA.

Further, the gate drive circuit 120 sequentially supplies the gate line GL with gate voltages such as an ON-level voltage or an OFF-level voltage according to the gate control signal GCS outputted from the timing controller 150.

The gate drive circuit 120 may be positioned at one side of the display panel 111 or at two opposite sides of the display panel 111 in some instances depending on driving methods.

The gate drive circuit 120 may include a shift register, a level shifter, and the like.

Based on the data control signal (DCS), the data drive circuit 130 converts the digital video data RGB, which is received from the timing controller 150, into the analog data voltages Vdata and outputs the analog data voltages Vdata to the data line DL.

The data drive circuit 130 may be connected to a bonding pad of the display panel 111 by a tape automated bonding method or a chip-on glass method or disposed directly on the display panel 111. In some instances, the data drive circuit 130 may be integrated on the display panel 111.

The data drive circuit 130 may include an output buffer, a digital analog converter (DAC), and a logic part including various circuits such as a level shifter and a latch part.

Touch drive circuit 140 is electrically connected to the touch sensor TS through a touch line TL and senses a touch position or whether the user's touch is made. That is, when the user touches a partial region of the touch panel 113, the touch drive circuit 140 detects a touch signal of the touch sensor TS and determines a touch position or whether the user's touch is made on the touch panel 113.

Specifically, the touch drive circuit 140 may supply a touch driving signal to each of the touch sensors TS. Further, the touch drive circuit 140 may receive a touch sensing signal from each of the touch sensors TS. The touch drive circuit 140 detects the touch on the touch panel 113 on the basis of the touch sensing signal.

Meanwhile, the method of detecting the touch by using the respective touch sensors TS may be a mutual capacitance method that detects a change in mutual capacitance of the touch sensor TS or a self-capacitance method that detects a change in self-capacitance of the touch sensor.

The micro-control unit 160 controls the touch drive circuit 140. The micro-control unit 160 may receive a vertical synchronization signal and a horizontal synchronization signal from the timing controller 150 and generate a touch synchronization signal Tsync for controlling the touch drive circuit 140 according to the vertical synchronization signal and the horizontal synchronization signal. The micro-control unit 160 transmits/receives the touch sensing signal to/from the touch drive circuit 140.

In this case, the micro-control unit 160, together with the touch drive circuit 140, constitutes a touch control circuit provided in the form of a single integrated circuit. Alternatively, the micro-control unit 160, together with the timing controller 150, constitutes a control circuit provided in the form of a single integrated circuit.

The power supply 170 may convert an input voltage, which is supplied from an external system, into a driving voltage required to operate the display device 100. Specifically, the power supply 170 converts at least one input voltage and outputs a first driving voltage Vout1 and a second driving voltage Vout2 to the timing controller 150 and the micro-control unit 160.

Further, the power supply 170 may output a reset signal Reset to the timing controller 150, and the reset signal Reset is used to control the timing controller 150.

In addition, the power supply 170 converts the input voltage and outputs a gate high-potential voltage, a source high-potential voltage, and a drive high-potential voltage. The gate high-potential voltage is a voltage used to generate a gate voltage and is supplied to the gate drive circuit 120. The source high-potential voltage is a high-potential power voltage applied to a gamma voltage divider circuit of the data drive circuit 130 that generates gamma reference voltages. The source high-potential voltage is supplied to the data drive circuit 130. The drive high-potential voltage is a voltage applied to an electroluminescent diode included in each of the plurality of pixels PX and is supplied to the plurality of pixels PX.

Figure 2:
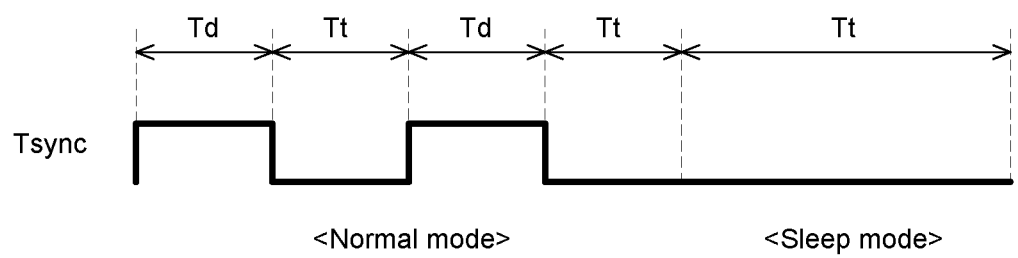
FIG. 2 is a timing diagram for a touch synchronization signal for normal and sleep modes of the touch display device according to the embodiment of the present disclosure.

FIG. 2 is a timing diagram for a touch synchronization signal for normal and sleep modes of the touch display device according to the embodiment of the present disclosure.

When the user does not use the display device, the touch display device according to the embodiment of the present disclosure switches to a sleep mode in order to reduce power consumption. When the user touches the touch panel 113, the touch display device performs a wake-up function and switches to a normal mode.

Specifically, because it is not necessary to display the image in the sleep mode, the display panel 111 does not operate, and the touch panel 113 operates and performs the touch function. In contrast, because it is necessary to display the image in the normal mode, both the display panel 111 and the touch panel 113 operate and perform the touch function and the display function.

That is, as illustrated in FIG. 2, in the normal mode, the touch display device operates in a display driving period Td and touch a driving period Tt that are temporally divided (e.g., alternate). The touch display device displays the image on the display panel 111 during the display driving period Td and senses the touch panel 113 during the touch driving period Tt. Further, in the sleep mode, the touch driving period Tt is present without any display driving periods TD, during which the touch display device senses the touch panel 113.

In this case, the time division between the display driving period Td and the touch driving period Tt may be implemented by the touch synchronization signal Tsync.

Specifically, during the touch driving period Tt, the touch synchronization signal Tsync at an ON level is applied to the touch drive circuit 140, such that the touch on the touch panel 113 is sensed. During the display driving period Td, the touch synchronization signal Tsync at an OFF level is applied to the touch drive circuit 140, such that the touch on the touch panel 113 is not sensed, and the data voltage of the display panel 111 is updated. In one embodiment, the ON level is a level of the touch synchronization signal Tsync that is set to operate the touch drive circuit 140, and the ON level is illustrated as a low level as shown in FIG. 2. In one embodiment, the OFF level means a level of the touch synchronization signal Tsync that is set so as not to operate the touch drive circuit 140, and the OFF level is illustrated as a high level as shown in FIG. 2.

Therefore, in the normal mode, the display driving period Td and the touch driving period Tt alternate, such that the touch synchronization signal Tsync is periodically toggled. However, because the touch driving period Tt is present in the sleep mode, the touch synchronization signal Tsync is fixed to the ON level (e.g., the low level).

Figure 3:
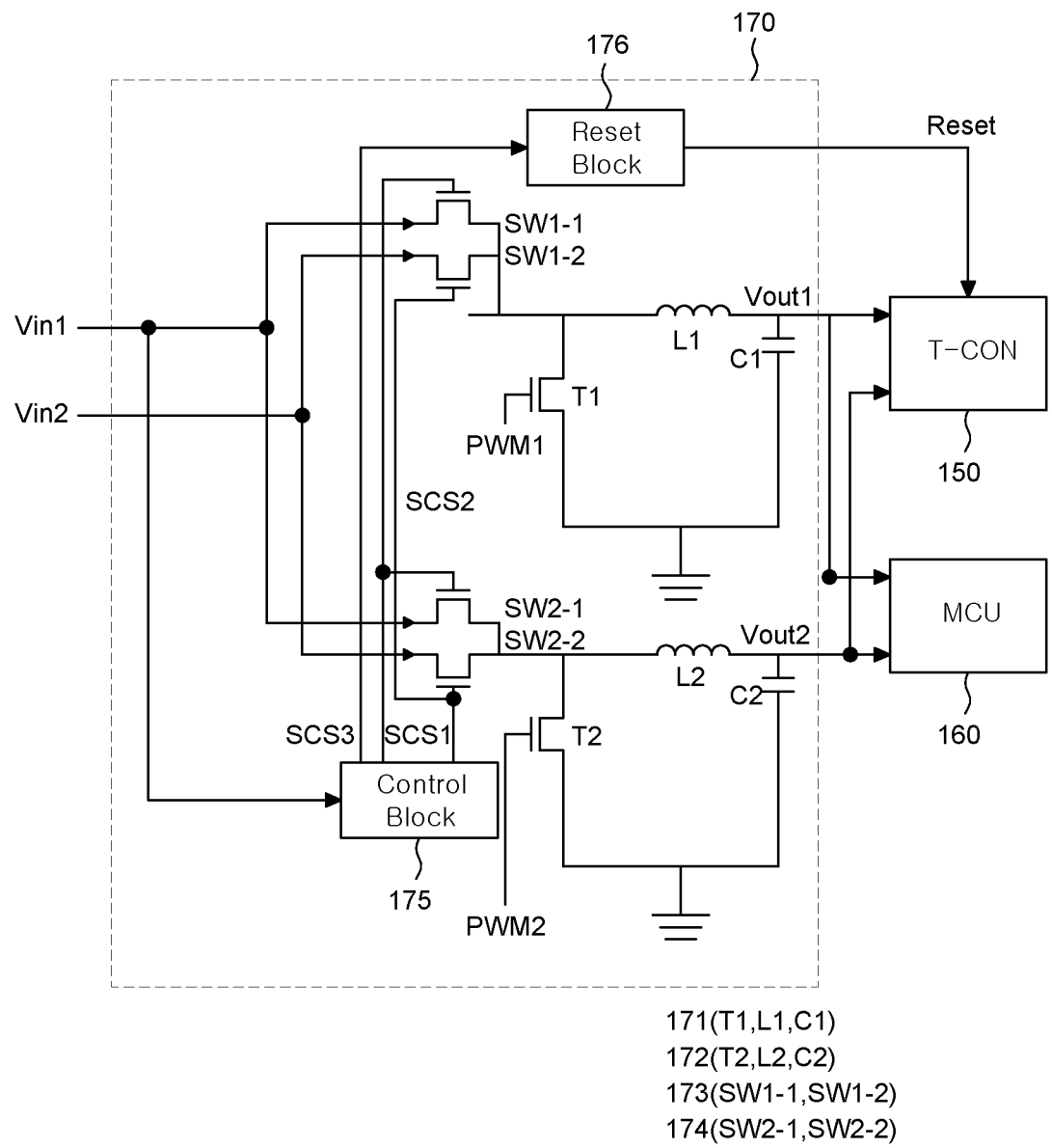
FIG. 3 is a circuit diagram illustrating a power supply of the touch display device according to the embodiment of the present disclosure.

FIG. 3 is a circuit diagram illustrating a power supply of the touch display device according to the embodiment of the present disclosure.

In one embodiment, the power supply 170 includes a first converter 171, a second converter 172, a first switching unit 173, a second switching unit 174, a switching control circuit (control block) 175, and a reset circuit (reset block) 176.

The first converter 171 lowers a first input voltage Vin1 or a second input voltage Vin2 to a first driving voltage Vout1 required for the display device 100. That is, the first converter 171 may be a buck converter or a step-down converter configured to convert the first input voltage Vin1 or the second input voltage Vin2 into the first driving voltage Vout1 by lowering the first input voltage Vin1 or the second input voltage Vin2.

The second converter 172 lowers a first input voltage Vin1 or a second input voltage Vin2 to a second driving voltage Vout2 required for the display device 100. That is, the second converter 172 may be a buck converter or a step-down converter configured to convert the first input voltage Vin1 or the second input voltage Vin2 into the second driving voltage Vout2 by lowering the first input voltage Vin1 or the second input voltage Vin2.

The first switching unit 173 outputs any one of the first input voltage Vin1 and the second input voltage Vin2 to an input port of the first converter 171. The first switching unit 173 is electrically connected to the input port of the first converter 171 and outputs any one of the first input voltage Vin1 and the second input voltage Vin2 according to a first switching control signal SCS1 and a second switching control signal SCS2.

The second switching unit 174 outputs any one of the first input voltage Vin1 and the second input voltage Vin2 to an input port of the second converter 172. The second switching unit 174 is electrically connected to the input port of the second converter 172 and outputs any one of the first input voltage Vin1 and the second input voltage Vin2 according to the first switching control signal SCS1 and the second switching control signal SCS2.

The switching control circuit 175 controls the first switching unit 173, the second switching unit 174, and the reset circuit 176. Specifically, the switching control circuit 175 outputs the first switching control signal SCS1 and the second switching control signal SCS2 for controlling the first switching unit 173 and the second switching unit 174 and outputs a third switching control signal SCS3 for controlling the reset circuit 176.

The reset circuit 176 performs on/off control on the timing controller 150. The reset circuit 176 performs the on/off control on the timing controller 150 by outputting the reset signal Reset to the timing controller 150.

Hereinafter, a circuit configuration of the power supply will be specifically described with reference to FIGS. 3 and 4.

Figure 4:
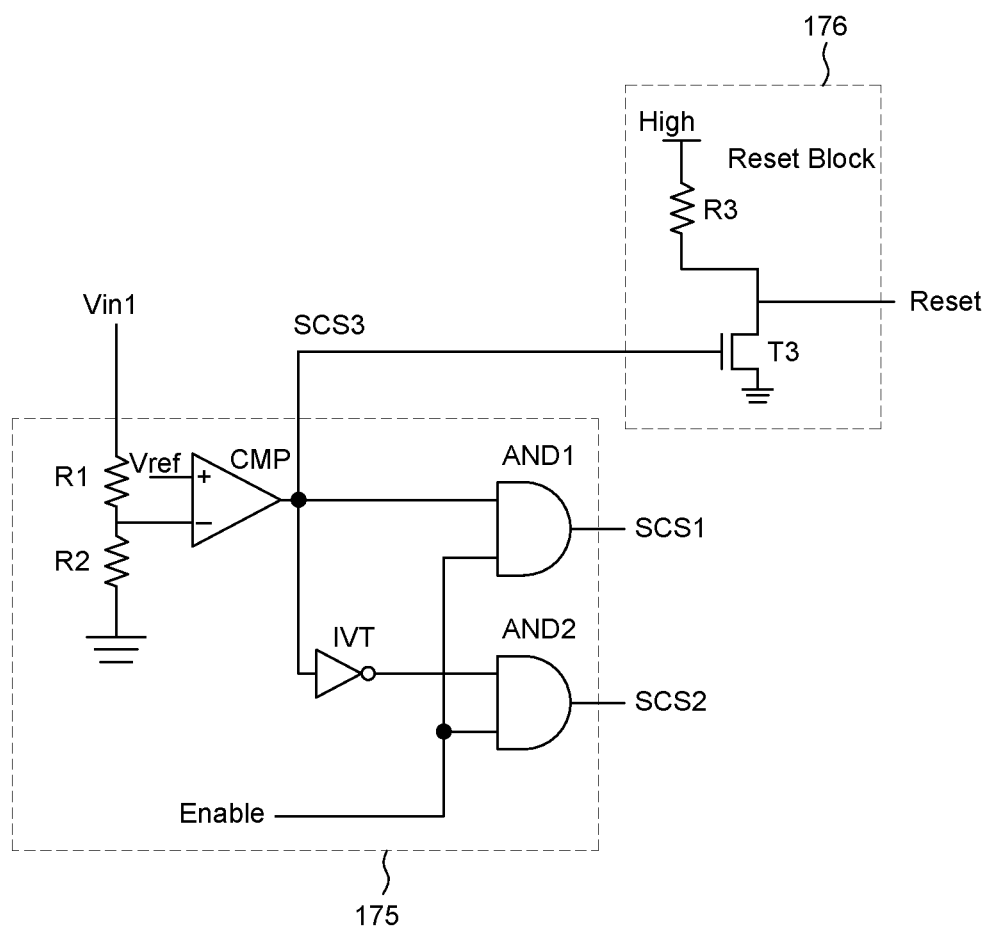
FIG. 4 is a circuit diagram illustrating a switching control circuit and a reset circuit of the touch display device according to the embodiment of the present disclosure.

FIG. 4 is a circuit diagram illustrating a switching control circuit and a reset circuit of the touch display device according to the embodiment of the present disclosure.

Referring to FIG. 3, the first converter 171 includes a first inductor L1, a first transistor T1, and a first capacitor C1 according to one embodiment.

Specifically, any one of the first input voltage Vin1 and the second input voltage Vin2 is applied to one end of the first inductor L1, which is the input port of the first converter 171, through the first switching unit 173. The first capacitor C1 is connected to the other end of the first inductor L1 that is an output port of the first converter 171. Further, a first PWM signal PWM1 is applied to a gate electrode of the first transistor T1, a source electrode of the first transistor T1 is connected to one end of the first inductor L1, and a drain electrode of the first transistor T1 is grounded.

Therefore, the first PWM signal PWM1 controls the first transistor T1, such that the first converter 171 may generate the first driving voltage Vout1 by using the first inductor L1.

Further, the second converter 172 includes a second inductor L2, a second transistor T2, and a second capacitor C2 according to one embodiment.

Specifically, any one of the first input voltage Vin1 and the second input voltage Vin2 is applied to one end of the second inductor L2, which is the input port of the second converter 172, through the second switching unit 174. The second capacitor C2 is connected to the other end of the second inductor L2 that is the output port of the second converter 172. Further, a second PWM signal PWM2 is applied to a gate electrode of the second transistor T2, a source electrode of the second transistor T2 is connected to one end of the second inductor L2, and a drain electrode of the second transistor T2 is grounded.

Therefore, the second PWM signal PWM2 controls the second transistor T2, such that the second converter 172 may generate the second driving voltage Vout2 by using the second inductor L2.

The first switching unit 173 includes a 1-1 switching element SW1-1 configured to output the first input voltage Vin1 to the first converter 171 according to the first switching control signal SCS1, and a 1-2 switching element SW1-2 configured to output the second input voltage Vin2 to the first converter 171 according to the second switching control signal SCS2 according to one embodiment.

Specifically, the 1-1 switching element SW1-1 includes a gate electrode configured to receive the first switching control signal SCS1, a source electrode configured to receive the first input voltage Vin1, and a drain electrode connected to the first converter 171. Further, the 1-2 switching element SW1-2 includes a gate electrode configured to receive the second switching control signal SCS2, a source electrode configured to receive the second input voltage Vin2, and a drain electrode connected to the first converter 171.

The second switching unit 174 includes a 2-1 switching element SW2-1 configured to output the first input voltage Vin1 to the second converter 172 according to the first switching control signal SCS1, and a 2-2 switching element SW2-2 configured to output the second input voltage Vin2 to the second converter 172 according to the second switching control signal SCS2 according to one embodiment.

Specifically, the 2-1 switching element SW2-1 includes a gate electrode configured to receive the first switching control signal SCS1, a source electrode configured to receive the first input voltage Vint, and a drain electrode connected to the second converter 172. Further, the 2-2 switching element SW2-2 includes a gate electrode configured to receive the second switching control signal SCS2, a source electrode configured to receive the second input voltage Vin2, and a drain electrode connected to the second converter 172.

Referring to FIG. 4, the switching control circuit 175 may include a comparator CMP, an inverter IVT, and a plurality of AND logic circuits AND1 and AND2 according to one embodiment.

The comparator CMP compares the first input voltage Vin1 and a reference voltage Vref and outputs a comparison signal.

Specifically, the reference voltage Vref is applied to a non-inverting terminal of the comparator CMP. A first input voltage (R2/(R1+R2)*Vin1), which has been subjected to voltage distribution by a plurality of resistors R1 and R2, is applied to an inverting terminal of the comparator CMP. More specifically, the comparator CMP compares the first input voltage Vin1, which has been subjected to the voltage distribution by the plurality of resistors R1 and R2, with the reference voltage Vref and outputs a comparison signal.

Further, as described below, the first input voltage Vin1 is at the ON level in the normal mode, and at the OFF level in the sleep mode. Further, the reference voltage Vref is fixed at a level between the ON level and the OFF level.

Therefore, because the first input voltage Vin1, which has been subjected to the voltage distribution by the plurality of resistors R1 and R2, is higher than the reference voltage Vref in the normal mode, the comparator CMP outputs a comparison signal at the ON level. Further, because the first input voltage Vin1, which has been subjected to the voltage distribution by the plurality of resistors R1 and R2, is lower than the reference voltage in the sleep mode, the comparator CMP outputs a comparison signal at the OFF level.

The first AND logic circuit AND1 receives the comparison signal and a enable signal Enable at the ON level and outputs the first switching control signal SCS1.

The enable signal Enable maintains the ON level while the first converter 171 and the second converter 172 operate. The enable signal Enable maintains the OFF level while the first converter 171 and the second converter 172 do not operate. However, in the display device according to the embodiment of the present disclosure, the first converter 171 and the second converter 172 always operate, such that the enable signal Enable always maintains the ON level.

The enable signal Enable always maintains the ON level. Therefore, the first AND logic circuit AND1 outputs the first switching control signal SCS1 at the ON level when the comparison signal at the ON level is applied. The first AND logic circuit AND1 outputs the first switching control signal SCS1 at the OFF level when the comparison signal at the OFF level is applied.

In other words, the first AND logic circuit AND1 may output the first switching control signal SCS1 at the ON level in the normal mode. The first AND logic circuit AND1 may output the first switching control signal SCS1 at the OFF level in the sleep mode.

The second AND logic circuit AND2 receives an inverted comparison signal and the enable signal at the ON level and outputs the second switching control signal SCS2.

The inverted comparison signal is a signal made as the inverter IVT inverts the comparison signal outputted from the comparator CMP. Therefore, the comparison signal and the inverted comparison signal may be different from each other in terms of the voltage level.

Further, the enable signal Enable always maintains the ON level. Therefore, the second AND logic circuit AND2 outputs the second switching control signal SCS2 at the ON level when the inverted comparison signal at the ON level is applied. The second AND logic circuit AND2 outputs the second switching control signal SCS2 at the OFF level when the inverted comparison signal at the OFF level is applied.

In other words, the second AND logic circuit AND2 may output the second switching control signal SCS2 at the OFF level in the normal mode. The second AND logic circuit AND2 may output the second switching control signal SCS2 at the ON level in the sleep mode.

Further, the comparison signal may be outputted, as the third switching control signal SCS3, to the reset circuit 176.

In other words, the third switching control signal SCS3 is at the ON level in the normal mode, and the third switching control signal SCS3 is at the OFF level in the sleep mode.

Further, the reset circuit 176 may include a third transistor T3 including a gate electrode configured to receive the third switching control signal SCS3, a drain electrode connected to the timing controller 150 and an ON level power (High), and a grounded source electrode according to one embodiment.

Therefore, when the third switching control signal SCS3 at the ON level is applied in the normal mode, the reset circuit 176 is turned on and outputs the reset signal Reset at the OFF level to the timing controller 150 through a grounding terminal.

Further, when the third switching control signal SCS3 at the OFF level is applied in the sleep mode, the reset circuit 176 is turned off and outputs the reset signal Reset at the ON level to the timing controller 150 through the resistor.

Figure 5:
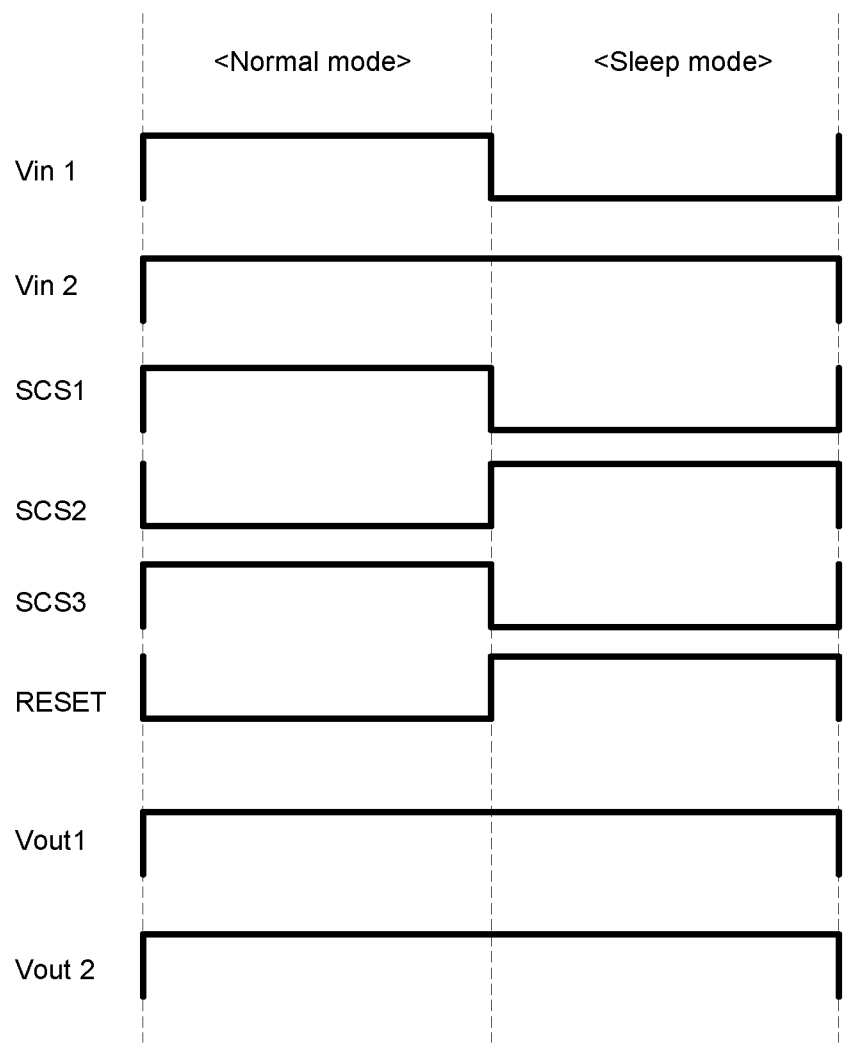
FIG. 5 is a timing diagram illustrating signals and voltage levels of the touch display device according to the embodiment of the present disclosure.

FIG. 5 is a timing diagram illustrating signals and voltage levels of the touch display device according to the embodiment of the present disclosure.

Figure 6:
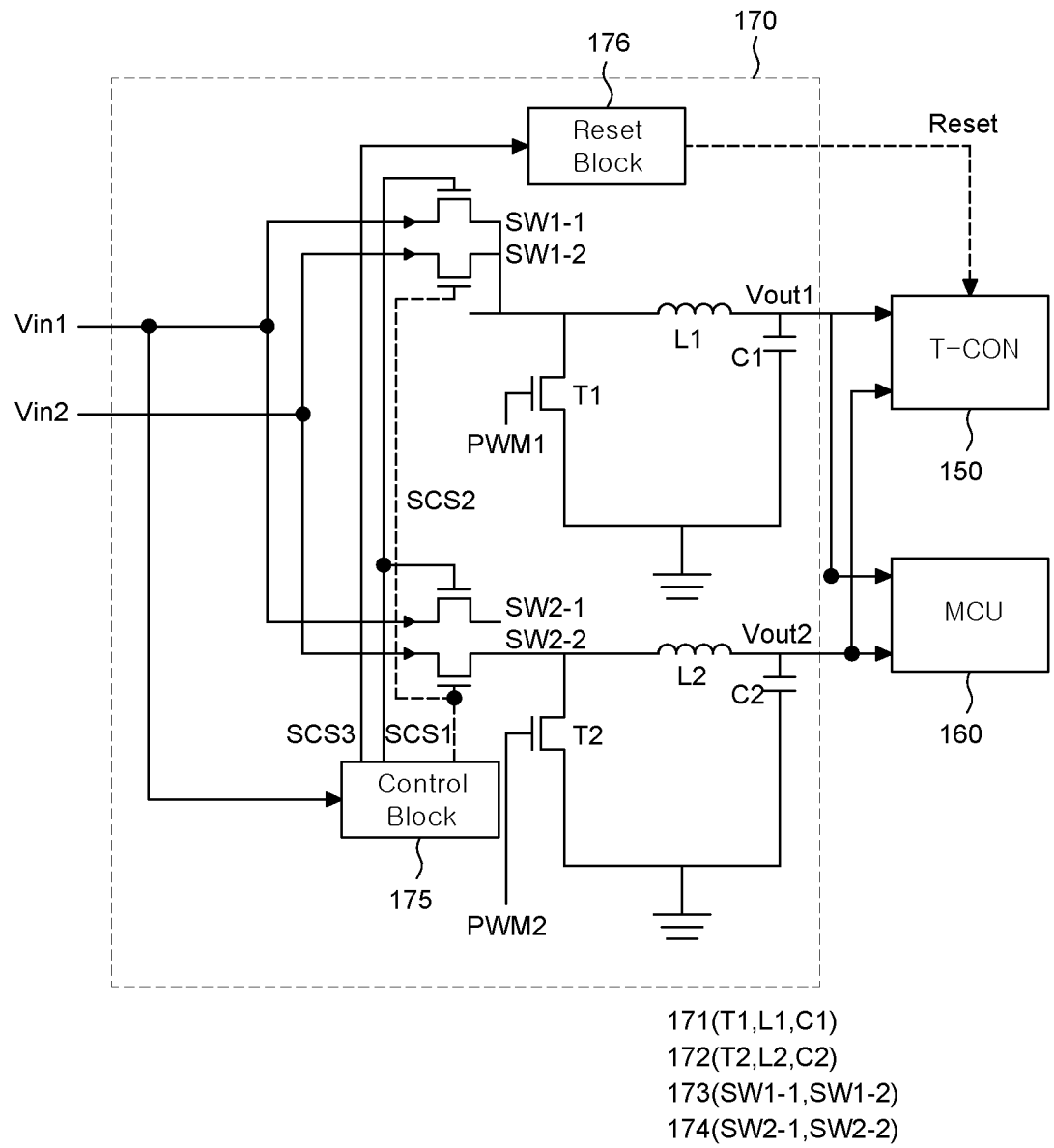
FIG. 6 is a circuit diagram illustrating an operation in a normal mode of the touch display device according to the embodiment of the present disclosure.

FIG. 6 is a circuit diagram illustrating an operation in the normal mode of the touch display device according to the embodiment of the present disclosure.

Figure 7:
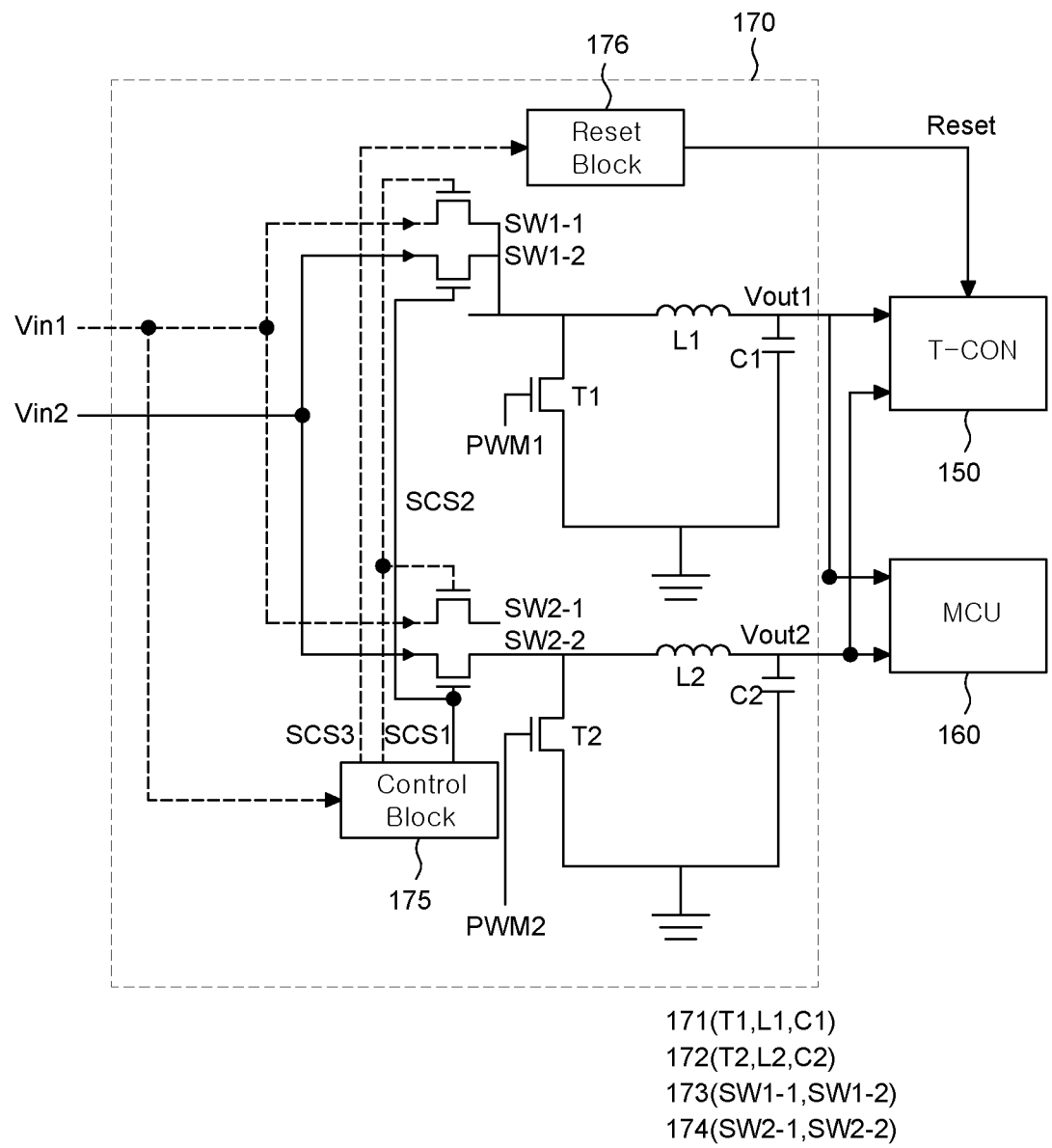
FIG. 7 is a circuit diagram illustrating an operation in a sleep mode of the touch display device according to the embodiment of the present disclosure.

FIG. 7 is a circuit diagram illustrating an operation in the sleep mode of the touch display device according to the embodiment of the present disclosure.

In FIGS. 6 and 7, each of solid lines means the ON level of the first input voltage Vint, the second input voltage Vin2, the first switching control signal SCS1, the second switching control signal SCS2, the third switching control signal SCS3, and the reset signal Reset. And In FIGS. 6 and 7, each of dashed lines means the OFF level of the first input voltage Vint, the second input voltage Vin2, the first switching control signal SCS1, the second switching control signal SCS2, the third switching control signal SCS3, and the reset signal Reset.

FIG. 5 illustrates that the first input voltage Vint, the second input voltage Vin2, the first switching control signal SCS1, the second switching control signal SCS2, the third switching control signal SCS3, and the reset signal Reset are each set to at least one of the ON level and the OFF level in one embodiment. However, the ON levels of the first input voltage Vint, the second input voltage Vin2, the first switching control signal SCS1, the second switching control signal SCS2, the third switching control signal SCS3, and the reset signal Reset may be different from one another. Further, the OFF levels of the first input voltage Vint, the second input voltage Vin2, the first switching control signal SCS1, the second switching control signal SCS2, the third switching control signal SCS3, and the reset signal Reset may be different from one another.

In the embodiment, referring to FIG. 5, in both the normal mode and the sleep mode, the first driving voltage Vout1 may be about 1.2 V, the second driving voltage Vout2 may be about 1.8 V.

Referring to FIGS. 5 and 6, in the normal mode, both the first input voltage Vin1 and the second input voltage Vin2 may be at the ON level. For example, the first input voltage Vin1 and the second input voltage Vin2 may be applied as 5 V.

Therefore, the switching control circuit 175 receives the first input voltage Vin1 at the ON level and outputs the first switching control signal SCS1 at the ON level, the second switching control signal SCS2 at the OFF level, and the third switching control signal SCS3 at the ON level.

As the first switching control signal SCS1 at the ON level and the second switching control signal SCS2 at the OFF level are applied to the first switching unit 173, the 1-1 switching element SW1-1 of the first switching unit 173 is turned on, such that the first input voltage Vin1 is applied to the first converter 171.

Further, the first converter 171 converts the first input voltage Vin1 into the first driving voltage Vout1 and outputs the first driving voltage Vout1 to the timing controller 150 and the micro-control unit 160.

As the first switching control signal SCS1 at the ON level and the second switching control signal SCS2 at the OFF level are applied to the second switching unit 174, the 2-1 switching element SW2-1 of the second switching unit 174 is turned on, such that the first input voltage Vin1 is applied to the second converter 172.

Further, the second converter 172 converts the first input voltage Vin1 into the second driving voltage Vout2 and outputs the second driving voltage Vout2 to the timing controller 150 and the micro-control unit 160.

Further, the reset circuit 176 receives the third switching control signal SCS3 at the ON level and outputs the reset signal Reset at the OFF level to the timing controller 150. Therefore, the timing controller 150 keeps operating without being reset according to the reset signal Reset at the OFF level.

Referring to FIGS. 5 and 7, in the sleep mode, the first input voltage Vin1 may be at the OFF level, and the second input voltage Vin2 may be at the ON level. For example, the first input voltage Vin1 may be 0 V, and the second input voltage Vin2 may be applied as 5 V.

Therefore, the switching control circuit 175 receives the first input voltage Vin1 at the OFF level and outputs the first switching control signal SCS1 at the OFF level, the second switching control signal SCS2 at the ON level, and the third switching control signal SCS3 at the OFF level.

As the first switching control signal SCS1 at the OFF level and the second switching control signal SCS2 at the ON level are applied to the first switching unit 173, the 1-2 switching element SW1-2 of the first switching unit 173 is turned on, such that the second input voltage Vin2 is applied to the first converter 171.

Further, the first converter 171 converts the second input voltage Vin2 into the first driving voltage Vout1 and outputs the first driving voltage Vout1 to the timing controller 150 and the micro-control unit 160.

As the first switching control signal SCS1 at the OFF level and the second switching control signal SCS2 at the ON level are applied to the second switching unit 174, the 2-2 switching element SW2-2 of the second switching unit 174 is turned on, such that the second input voltage Vin2 is applied to the second converter 172.

Further, the second converter 172 converts the second input voltage Vin2 into the second driving voltage Vout2 and outputs the second driving voltage Vout2 to the timing controller 150 and the micro-control unit 160.

Further, the reset circuit 176 receives the third switching control signal SCS3 at the OFF level and outputs the reset signal Reset at the ON level to the timing controller 150. Therefore, the timing controller 150 stops operating by being reset according to the reset signal Reset at the ON level.

A display device in the related art requires two converters for supplying first and second driving voltages to a timing controller and requires two converters for supplying first and second driving voltages to a micro-control unit in order to implement normal and sleep modes. Therefore, the display device in the related art requires a total of four converters.

In contrast, the display device according to the embodiment of the present disclosure may use the two switching units coupled to the converters and thus outputs the first driving voltage Vout1 and the second driving voltage Vout2 to the timing controller 150 and the micro-control unit 160 in the normal mode and the sleep mode only by using the two converters.

That is, the number of converters required for the power supply 170 of the display device according to the embodiment of the present disclosure is reduced, which may simplify the circuit configuration of the power supply 170.

In addition, in the display device according to the embodiment of the present disclosure, the circuit configuration of the power supply 170 is simplified, such that a loss of power consumption minimized.

Hereinafter, a display device according to another embodiment of the present disclosure will be described. The display device according to another embodiment of the present disclosure differs from the display device according to the above-mentioned embodiment of the present disclosure only in terms of types of converters. Therefore, the description will be made focusing on the converter. Further, the description of the configuration of the display device according to another embodiment of the present disclosure, which is identical to the configuration of the display device according to the above-mentioned embodiment of the present disclosure, will be omitted.

Figure 8:
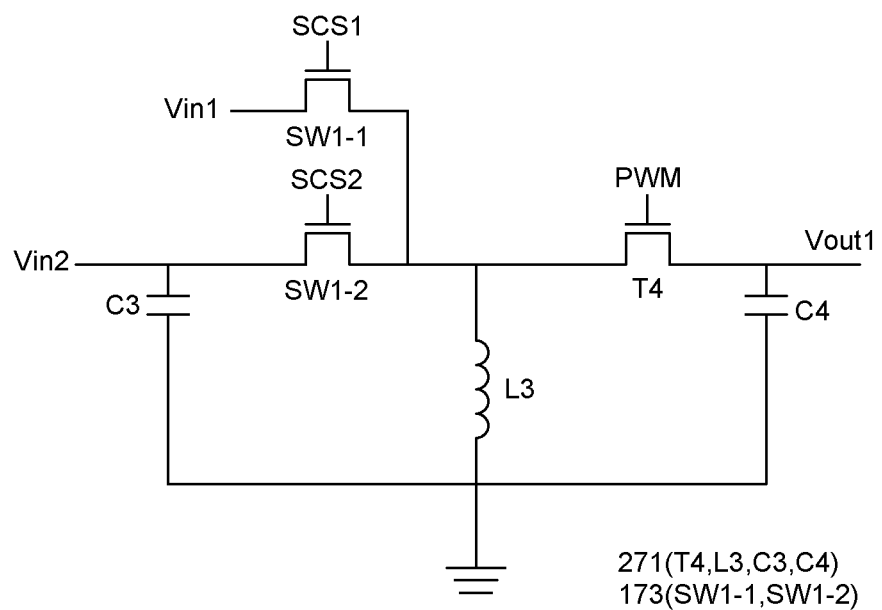
FIG. 8 is a circuit diagram illustrating a switching unit and a converter included in a power supply of a display device according to another embodiment of the present disclosure.

FIG. 8 is a circuit diagram illustrating a switching unit and a converter included in a power supply of a display device according to another embodiment of the present disclosure.

Specifically, FIG. 8 illustrates a first switching unit and a first converter of the display device according to another embodiment of the present disclosure. Even in the display device according to the embodiment of the present disclosure, the first switching unit and the first converter respectively have the same circuit structures as the second switching unit and the second converter, as described above. Therefore, for the convenience of description, only the first switching unit and the first converter will be described below.

Further, because the first switching unit 173 of the display device according to the above-mentioned embodiment of the present disclosure is identical to the first switching unit of the display device according to another embodiment of the present disclosure, the same reference numerals will be used.

Referring to FIG. 8, a first converter 271 is a buck-boost converter configured to convert the first input voltage Vin1 or the second input voltage Vin2 into the first driving voltage Vout1 by raising or lowering the first input voltage Vin1 or the second input voltage Vin2. Although not specifically illustrated in FIG. 8, the second converter may also be a buck-boost converter configured to convert the first input voltage or the second input voltage into the second driving voltage by raising or lowering the first input voltage or the second input voltage.

The first switching unit 173 includes a 1-1 switching element SW1-1 configured to output the first input voltage Vin1 to the first converter 271 according to the first switching control signal SCS1, and a 1-2 switching element SW1-2 configured to output the second input voltage Vin2 to the first converter 271 according to the second switching control signal SCS2 according to one embodiment.

Specifically, the 1-1 switching element SW1-1 includes a gate electrode configured to receive the first switching control signal SCS1, a source electrode configured to receive the first input voltage Vin1, and a drain electrode connected to the first converter 271 according to one embodiment. Further, the 1-2 switching element SW1-2 includes a gate electrode configured to receive the second switching control signal SCS2, a source electrode configured to receive the second input voltage Vin2, and a drain electrode connected to the first converter 271 according to one embodiment.

Referring to FIG. 8, the first converter 271 includes a third inductor L3, a fourth transistor T4, and a plurality of capacitors C3 and C4 according to one embodiment.

Specifically, any one of the first input voltage Vin1 and the second input voltage Vin2 is applied to one end of the third inductor L3 through the first switching unit 173, and the third capacitor C3 and the fourth capacitor C4 are electrically connected to the other end of the third inductor L3.

Further, the second input voltage Vin2 is applied to one end of the third capacitor C3, and the first driving voltage Vout1 is applied to one end of the fourth capacitor C4. Further, the PWM signal is applied to a gate electrode of the fourth transistor T4. A source electrode of the fourth transistor T4 is connected to one end of the third inductor L3. The first driving voltage Vout1 is outputted through a drain electrode of the fourth transistor T4.

Therefore, the PWM signal controls the fourth transistor T4, such that the first converter 271 may output the first driving voltage Vout1 by using the third inductor L3.

That is, the converter of the display device according to another embodiment of the present disclosure may be applied as a buck-boost converter configured to convert the input voltage into the driving voltage Vout1 by raising or lowering the input voltage.

Hereinafter, a display device according to still another embodiment of the present disclosure will be described. The display device according to still another embodiment of the present disclosure differs from the display device according to the above-mentioned embodiment of the present disclosure only in terms of types of converters. Therefore, the description will be made focusing on the converter. Further, the description of the configuration of the display device according to still another embodiment of the present disclosure, which is identical to the configuration of the display device according to the above-mentioned embodiment of the present disclosure, will be omitted.

Figure 9:
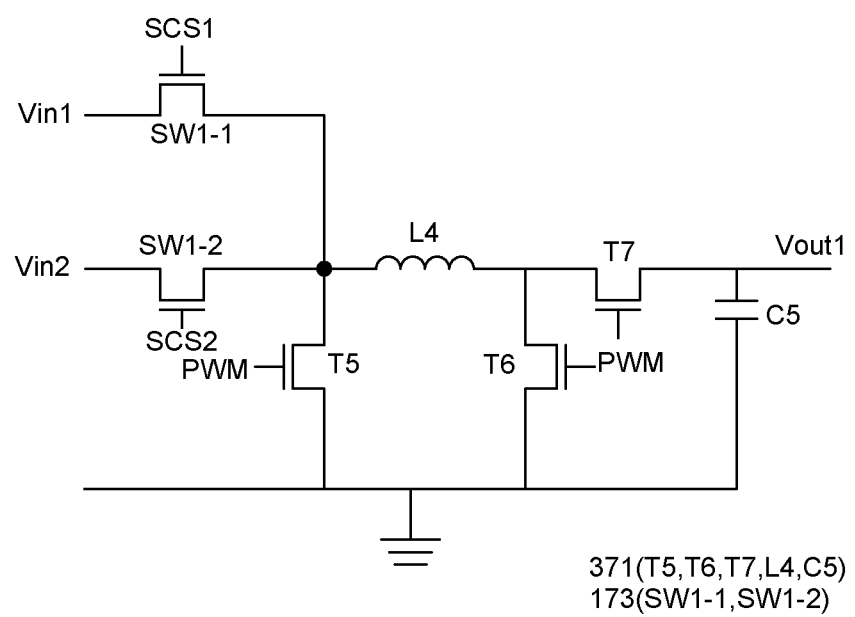
FIG. 9 is a circuit diagram illustrating a switching unit and a converter included in a power supply of a display device according to still another embodiment of the present disclosure.

FIG. 9 is a circuit diagram illustrating a switching unit and a converter included in a power supply of a display device according to still another embodiment of the present disclosure.

Specifically, FIG. 9 illustrates a first switching unit and a first converter of the display device according to still another embodiment of the present disclosure. Even in the display device according to the embodiment of the present disclosure, the first switching unit and the first converter respectively have the same circuit structures as the second switching unit and the second converter, as described above. Therefore, for the convenience of description, only the first switching unit and the first converter will be described below.

Further, because the first switching unit 173 of the display device according to the above-mentioned embodiment of the present disclosure is identical to the first switching unit of the display device according to still another embodiment of the present disclosure, the same reference numerals will be used.

Referring to FIG. 9, a first converter 371 is an inverting buck-boost converter configured to convert the first input voltage Vin1 or the second input voltage Vin2 into the first driving voltage Vout1 by inverting the first input voltage Vin1 or the second input voltage Vin2 and then raising or lowering the inverted first input voltage Vin1 or the inverted second input voltage Vin2. Although not specifically illustrated in FIG. 9, the second converter may also be a buck-boost converter configured to convert the first input voltage or the second input voltage into the second driving voltage by inverting the first input voltage or the second input voltage and then raising or lowering the inverted first input voltage or the inverted second input voltage.

Specifically, the first converter 371 includes a fourth inductor L4, a fifth capacitor C5, a plurality of transistors T5, T6, and T7 according to one embodiment.

Specifically, any one of the first input voltage Vin1 and the second input voltage Vin2 is applied to one end of the fourth inductor L4 through the first switching unit 173, and the fifth transistor T5 is electrically connected to one end of the fourth inductor L4. The sixth transistor T6 and the seventh transistor T7 are electrically connected to the other end of the fourth inductor L4. Further, the first driving voltage Vout1 is applied to one end of the fifth capacitor C5, and the other end of the fifth capacitor C5 is grounded. Further, the PWM signal is applied to a gate electrode of the fifth transistor T5. A source electrode of the fifth transistor T5 is electrically connected to one end of the fourth inductor L4. A drain electrode of the fifth transistor T5 is grounded. Further, the PWM signal is applied to a gate electrode of the sixth transistor T6. A source electrode of the sixth transistor T6 is electrically connected to the other end of the fourth inductor L4. A drain electrode of the sixth transistor T6 is grounded. Further, the PWM signal is applied to a gate electrode of the seventh transistor T7. A source electrode of the seventh transistor T7 is electrically connected to the other end of the fourth inductor L4. The first driving voltage Vout1 is outputted through the drain electrode of the seventh transistor T7.

Therefore, the PWM signal controls the plurality of transistors T5, T6, and T7, such that the first converter 371 may output the first driving voltage Vout1 by using the fourth inductor L4.

That is, the converter of the display device according to still another embodiment of the present disclosure may be applied as a buck-boost converter configured to convert the input voltage into the driving voltage Vout1 by inverting the input voltage and then raising or lowering the inverted input voltage.

The exemplary embodiments of the present disclosure can also be described as follows:

According to an aspect of the present disclosure, a touch display device is configured to operate divided into a normal mode in which the touch display device performs both a touch function and a display function and a sleep mode in which the touch display device performs only a touch function, and the touch display device includes: a display panel on which a plurality of pixels is disposed; a touch panel on which a plurality of touch sensors is disposed; a data drive circuit configured to supply a data voltage to the plurality of pixels; a touch drive circuit configured to supply a touch driving signal to the plurality of touch sensors; a timing controller configured to supply a data control signal to the data drive circuit; a micro-control unit configured to supply a touch synchronization signal to the touch drive circuit; and a power supply configured to supply a first driving voltage and a second driving voltage to the timing controller and the micro-control unit, in which the power supply includes: a first converter configured to output the first driving voltage; a second converter configured to output the second driving voltage; a first switching unit configured to supply the first input voltage or the second input voltage to the first converter; a second switching unit configured to supply the first input voltage or the second input voltage to the second converter; and a switching control circuit configured to control the first switching unit and the second switching unit. Therefore, it is possible to minimize power consumption of the power supply.

The first input voltage may be at an ON level in the normal mode and at an OFF level in the sleep mode, the second input voltage may be at an ON level in both the normal mode and the sleep mode.

The switching control circuit may output a first switching control signal at the ON level and a second switching control signal at the OFF level in the normal mode, and the switching control circuit may output the first switching control signal at the OFF level and the second switching control signal at the ON level in the sleep mode.

The switching control circuit may comprise a comparator configured to compare the first input voltage and a reference voltage and output a comparison signal; a first AND logic circuit configured to receive the comparison signal and an enable signal at the ON level and output a first switching control signal; and a second AND logic circuit configured to receive the inverted comparison signal and the enable signal at the ON level and output a second switching control signal.

The first switching unit may comprise a 1-1 switching element configured to output the first input voltage to the first converter according to the first switching control signal; and a 1-2 switching element configured to output the second input voltage to the first converter according to the second switching control signal.

The second switching unit may comprise a 2-1 switching element configured to output the first input voltage to the second converter according to the first switching control signal; and a 2-2 switching element configured to output the second input voltage to the second converter according to the second switching control signal.

The first converter may be a buck converter configured to convert the first input voltage or the second input voltage into the first driving voltage by lowering the first input voltage or the second input voltage, and the second converter may be a buck converter configured to convert the first input voltage or the second input voltage into the second driving voltage by lowering the first input voltage or the second input voltage.

The first converter may be a buck-boost converter configured to convert the first input voltage or the second input voltage into the first driving voltage by raising or lowering the first input voltage or the second input voltage, and the second converter may be a buck-boost converter configured to convert the first input voltage or the second input voltage into the second driving voltage by raising or lowering the first input voltage or the second input voltage.

The first converter may be an inverting buck-boost converter configured to convert the first input voltage or the second input voltage into the first driving voltage by inverting the first input voltage or the second input voltage and then raising or lowering the inverted first input voltage or the inverted second input voltage, and the second converter may be an inverting buck-boost converter configured to convert the first input voltage or the second input voltage into the second driving voltage by inverting the first input voltage or the second input voltage and then raising or lowering the inverted first input voltage or the inverted second input voltage.

The power supply further may comprise a reset circuit configured to output a reset signal for controlling an operation of the timing controller.

The switching control circuit may output a third switching control signal for controlling the reset circuit, the third switching control signal may be at the ON level in the normal mode, and the third switching control signal may be at the OFF level in the sleep mode.

The reset circuit may receive the third switching control signal at the ON level and may output the reset signal at the OFF level to the timing controller, such that the timing controller keeps operating, and wherein the reset circuit receives the third switching control signal at the OFF level and may output the reset signal at the ON level to the timing controller, such that the timing controller stops operating.

According to another aspect of the present disclosure, a power supply, which is configured to supply a first driving voltage for a display operation of a touch display device and a second driving voltage for a touch operation of the touch display device, the power supply comprise a first converter configured to output the first driving voltage; a second converter configured to output the second driving voltage; a first switching unit configured to output any one of a first input voltage and a second input voltage to the first converter according to a switching control signal; a second switching unit configured to output any one of the first input voltage and the second input voltage to the second converter according to the switching control signal; and a switching control circuit configured to output the switching control signal.

The switching control signal may comprise a first switching control signal and a second switching control signal, and the switching control circuit outputs the first switching control signal at an ON level and the second switching control signal at an OFF level in a first section and outputs the first switching control signal at the OFF level and the second switching control signal at the ON level in a second section.

The first switching unit may comprise a 1-1 switching element configured to output the first input voltage to the first converter when the first switching control signal at the ON level is applied; and a 1-2 switching element configured to output the second input voltage to the first converter when the second switching control signal at the ON level is applied.

The second switching unit may comprise a 2-1 switching element configured to output the first input voltage to the second converter when the first switching control signal at the ON level is applied; and a 2-2 switching element configured to output the second input voltage to the second converter when the second switching control signal at the ON level is applied.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A touch display device, which is configured to operate between a normal mode in which the touch display device performs both a touch function and a display function, and a sleep mode in which the touch display device performs a touch function without performing the display function, the touch display device comprising:
   a display panel including a plurality of pixels and a plurality of touch sensors;
   a data drive circuit configured to supply a data voltage to the plurality of pixels;
   a touch drive circuit configured to supply a touch driving signal to the plurality of touch sensors;
   a timing controller configured to supply a data control signal to the data drive circuit;
   a micro-control unit configured to supply a touch synchronization signal to the touch drive circuit; and
   a power supply configured to supply a first driving voltage and a second driving voltage to the timing controller and the micro-control unit, the power supply comprising:
      a first converter configured to output the first driving voltage;
      a second converter configured to output the second driving voltage;
      a first switching unit configured to supply a first input voltage or a second input voltage to the first converter;
      a second switching unit configured to supply the first input voltage or the second input voltage to the second converter; and
      a switching control circuit configured to control the first switching unit and the second switching unit.

2. The touch display device of claim 1, wherein the first input voltage is at an on level in the normal mode and at an off level in the sleep mode, the second input voltage is at the on level in both the normal mode and the sleep mode.

3. The touch display device of claim 1, wherein the switching control circuit outputs a first switching control signal at an on level and a second switching control signal at an off level in the normal mode, and the switching control circuit outputs the first switching control signal at the off level and the second switching control signal at on the on level in the sleep mode.

4. The touch display device of claim 3, wherein the first switching unit comprises:
   a 1-1 switching element configured to output the first input voltage to the first converter according to the first switching control signal; and
   a 1-2 switching element configured to output the second input voltage to the first converter according to the second switching control signal.

5. The touch display device of claim 3, wherein the second switching unit comprises:
   a 2-1 switching element configured to output the first input voltage to the second converter according to the first switching control signal; and
   a 2-2 switching element configured to output the second input voltage to the second converter according to the second switching control signal.

6. The touch display device of claim 1, wherein the switching control circuit comprises:
   a comparator configured to compare the first input voltage and a reference voltage and output a comparison signal;
   a first AND logic circuit configured to receive the comparison signal and an enable signal at an on level and output a first switching control signal; and
   a second AND logic circuit configured to receive an inverted comparison signal and the enable signal at the on level and output a second switching control signal.

7. The touch display device of claim 1, wherein the first converter is a buck converter configured to convert the first input voltage or the second input voltage into the first driving voltage by lowering the first input voltage or the second input voltage, and the second converter is a buck converter configured to convert the first input voltage or the second input voltage into the second driving voltage by lowering the first input voltage or the second input voltage.

8. The touch display device of claim 1, wherein the first converter is a buck-boost converter configured to convert the first input voltage or the second input voltage into the first driving voltage by raising or lowering the first input voltage or the second input voltage, and the second converter is a buck-boost converter configured to convert the first input voltage or the second input voltage into the second driving voltage by raising or lowering the first input voltage or the second input voltage.

9. The touch display device of claim 1, wherein the first converter is an inverting buck-boost converter configured to convert the first input voltage or the second input voltage into the first driving voltage by inverting the first input voltage or the second input voltage and then raising or lowering the inverted first input voltage or the inverted second input voltage, and the second converter is an inverting buck-boost converter configured to convert the first input voltage or the second input voltage into the second driving voltage by inverting the first input voltage or the second input voltage and then raising or lowering the inverted first input voltage or the inverted second input voltage.

10. The touch display device of claim 1, wherein the power supply further comprises a reset circuit configured to output a reset signal for controlling an operation of the timing controller.

11. The touch display device of claim 10, wherein the switching control circuit outputs a third switching control signal for controlling the reset circuit, the third switching control signal is at an on level in the normal mode, and the third switching control signal is at an off level in the sleep mode.

12. The touch display device of claim 11, wherein the reset circuit is configured to receive the third switching control signal at the on level and outputs the reset signal at the off level to the timing controller, such that the timing controller keeps operating, and wherein the reset circuit receives the third switching control signal at the off level and outputs the reset signal at the on level to the timing controller, such that the timing controller stops operating.

13. A power supply comprising:

a first converter configured to output a first driving voltage for a display operation of a touch display device;

a second converter configured to output a second driving voltage for a touch operation of the touch display device;

a first switching unit configured to output any one of a first input voltage and a second input voltage to the first converter according to a switching control signal;

a second switching unit configured to output any one of the first input voltage and the second input voltage to the second converter according to the switching control signal; and a switching control circuit configured to output the switching control signal.

14. The power supply of claim 13, wherein the switching control signal comprises a first switching control signal and a second switching control signal, and the switching control circuit outputs the first switching control signal at an on level and the second switching control signal at an off level in a first section and outputs the first switching control signal at the off level and the second switching control signal at on the off level in a second section.

15. The power supply of claim 14, wherein the first switching unit comprises:

a 1-1 switching element configured to output the first input voltage to the first converter when the first switching control signal at the on level is applied; and a 1-2 switching element configured to output the second input voltage to the first converter when the second switching control signal at the on level is applied.

16. The power supply of claim 14, wherein the second switching unit comprises:

a 2-1 switching element configured to output the first input voltage to the second converter when the first switching control signal at the on level is applied; and a 2-2 switching element configured to output the second input voltage to the second converter when the second switching control signal at the on level is applied.

* * * * *